July 25, 1961 A. W. TREPTOW 2,993,815
METALLIZING REFRACTORY SUBSTRATES
Filed May 25, 1959
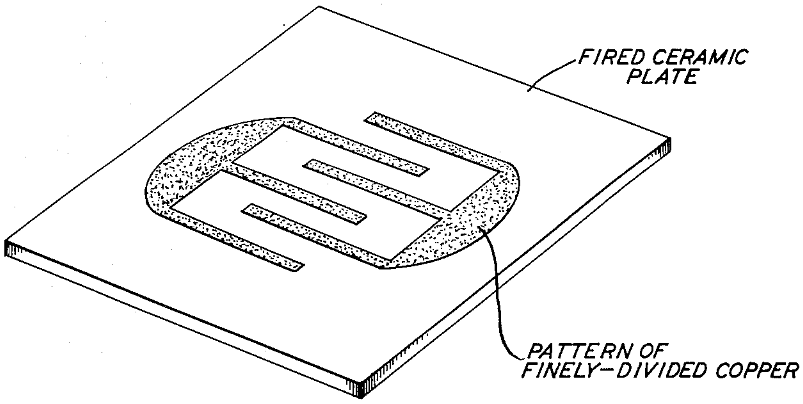
INVENTOR
A. W. TREPTOW
BY
George S. Indig
ATTORNEY

United States Patent Office 2,993,815

Patented July 25, 1961

2,993,815

METALLIZING REFRACTORY SUBSTRATES

Arnold W. Treptow, Fanwood, N.J., assignor to Bell Telephone Laboratories, Incorporated, New York, N.Y., a corporation of New York Filed May 25, 1959, Ser. No. 815,680
6 Claims. (Cl. 117—212)

This invention relates to an improved method of forming a highly conductive layer of copper adherently bonded to a refractory substrate and to devices utilizing such materials.

The term "refractory substrate" is used in the present application to mean a body made of a material which will not melt, decompose or materially change its shape or composition under the processing conditions involved in forming the copper layer. The refractory substrates suitable for use in the present invention may be broadly classified into four groups: the single crystalline materials such as sapphires (aluminum oxide) and semi-conductors which include, for example, reduced barium titanate and reduced rutile ($TiO_2$); the polycrystalline materials such as ceramics which include, for example, porcelains, steatites, aluminas and ferrites; the amphorous materials such as silicate glass; and materials known as "cermets," such as chromium-chromium oxide, which are a combination of a ceramic and a metal.

There are many uses for highly conductive copper layers on refractory substrates. Such uses include, for example, printed circuit boards, printed wiring boards and electrical contacts.

The use of powder metallurgical techniques to form the copper layer is complicated by the fact that elemental copper does not wet and bond to these refractory substrates. The prior art overcomes this problem by using copper oxide rather than copper since copper oxide readily wets and bonds to these substrates. However, when it is necessary to have a high conductor layer, the use of copper oxide is deleterious.

Briefly, in accordance with the present invention, there is described a process using a copper and glass-containing paste which results in a continuous adherent layer of elemental copper exhibiting excellent conductivity. The process entails a critical firing procedure using a controlled atmosphere of nitrogen, hydrogen and oxygen.

In accordance with this method an intimate mixture of finely divided copper or copper oxide and finely divided reduction-resistant glass is suspended in a volatile and decomposable fluid suspending medium. The mixture is applied to a refractory substrate which is first fired in an oxidizing atmosphere such as air or oxygen and is then fired in a controlled atmosphere of critical composition. This controlled atmosphere includes from 55 to 89 percent by volume of nitrogen, 8 to 44 percent by volume of hydrogen, and 0.4 to 6 percent by volume of oxygen.

Reference is made to the accompanying figure in the description of the invention. In this figure there is shown a printed circuit formed by the methods of this invention. The printed circuit comprises a continuous copper layer exhibiting excellent conductivity which is adherently bonded to a ceramic refractory substrate.

The copper used in the paste may be in the form of either elemental copper or copper oxide. In either instance, the particle should be finely divided so that a continuous layer of copper is formed on the refractory substrate by the processing steps. A suitable mean particle size range is, for example, one-half micron to 25 microns with a preference existing for particles of between one-half micron and 15 microns in the largest dimensions of the particles. Smaller particles, although not generally available, are equally satisfactory.

For convenience, the process is described herein as making use of elemental copper particles. However, as noted, the process is not so limited. The use, initially, of either elemental copper or copper oxide results after processing in a highly conductive adherent layer of copper on the refractory substrate.

Many different glasses are suitable for use. These glasses should fuse and bond to the refractory substrate at a temperature below the melting point of copper, 1083° C., and should resist reduction under the specified processing conditions. The need for glass flux metal pastes inert to reducing atmospheres has been recognized elsewhere in the art. The patent to J. W. Underwood, No. 2,282,106, granted May 5, 1942, is exemplary of a metal-to-ceramic seal in which the bond is completed by use of a glass not affected by firing in reducing atmospheres.

Glasses having these properties are readily compounded from mixtures of silica ($SiO_2$) and various combinations of the oxides of sodium ($Na_2O$), calcium ($CaO$), barium ($BaO$), magnesium ($MgO$), aluminum ($Al_2O_3$), boron ($B_2O_3$), potassium ($K_2O$) and phosphorus ($P_2O_5$), among other elements. Table I is illustrative of some suitable glasses which can be conveniently compounded from typical oxides specified as to kind and amount in the table. The table is not intended to be exhaustive of suitable glasses but indicates the general composition of some readily fusible nonreducible glasses. It is noted that this table encompasses many common types of glasses such as the borosilicates, phosphates and silicates.

TABLE I

| Melt ingredient: | Parts by weight |
|---|---|
| $Li_2O$ | 0–15 |
| $Na_2O$ | 0–25 |
| $CaO$ | 0–10 |
| $BaO$ | 0–20 |
| $MgO$ | 0–2 |
| $Al_2O_3$ | 0–35 |
| $SiO_2$ | 5–80 |
| $B_2O_3$ | 0–30 |
| $K_2O$ | 0–5 |
| $P_2O_5$ | 0–80 |

In the preparation of the glasses, the ingredients are smelted together in a furnace at a temperature sufficient to melt but not volatilize the constituent oxides, for example, between about 1100° C. and 1500° C., until a mass of uniform quality has been obtained. The melt is fritted by pouring into cold water, and the resultant frit is ground to the fineness desired. It is desirable for the glass particles to be finely divided, for example, in the order of one-half micron to 25 microns particle size, so that the paste mixture will, under the processing conditions, result in a continuous copper layer adherently bonded to the substrate.

The glass and copper particles are suspended in a volatile and decomposable fluid suspending agent and applied to the refractory oxide by any convenient method, for example, by dipping, brushing or spraying. The relative amounts of copper and glass used may vary over fairly wide limits. The main consideration is that the metal content be sufficiently high to insure that the resulting metal film after processing is continuous. Generally, between 5 to 50 parts by weight of copper is used for each part by weight of glass. The amount of fluid used as suspending agent depends on the method of application. If syraying is used, a relatively thin suspension is required. If brushing or "squeegee" screen processes are employed, thicker paste suspensions are permitted. The thickness of the applied paste suspension should be such as to insure good conductivity of the copper layer formed by the methods of the present invention. A 0.5 mil thick copper layer is adequate. The 1.0 mil thick copper layers formed by the methods of the following specific examples exhibit excellent conductivity. Greater thicknesses are feasible although the conductivity is already so high that no apparent advantage would be gained by such an increase.

The fluid suspending medium serves to disperse the paste mixture in the desired pattern on the substrate and to hold the paste in this pattern until processing commences. During processing the suspending medium should volatilize, leaving no residue. The suspending medium should not react with the metallic or glass components of the coating composition before or during firing.

To insure proper dispersion and bonding of the paste, many of the common suspending media contain two components. The first component acts as a dispersion medium for the paste and as a solvent for the second component which insures proper bonding of the paste to the substrate until processing commences. Examples of suitable dispersion media which are solvents for the below listed binders are benzene; the esters of fatty acids; alcohols of low molecular weight such as ethyl, butyl, and amyl; acetates including "Cellosolve acetate" (ethylene glycol monoethyl ether acetate), and "Carbitol acetate" (diethylene glycol monoethyl ether acetate); ketones such as acetone and methyl-ethyl-ketone; and higher ethers such as glycol diethyl ether. Suitable binders are, for example, the vinyl or substituted vinyl polymers such as polymethylmethacrylate, polyethylmethacrylate, polybutylmethacrylate, and polyisobutylmethacrylate and the cellulose esters and ethers such as cellulose nitrate, cellulose acetate, cellulose butyrate, methyl cellulose and ethyl cellulose. Rohm and Haas "Acryloid A–10," a solution of 30 percent polymethylmethacrylate solids in "Cellosolve acetate" has proved a good suspending medium.

In general, any ceramic which is resistant to the processing conditions of the instant invention may be used as the refractory substrate. The following table is illustrative of various ceramic compositions that have successfully been used. The compositions are expressed in parts by weight.

*Table II*

| Composition | Porcelain | | | | Steatite | Alumina | |
|---|---|---|---|---|---|---|---|
| | A | B | C | D | E | F | G |
| Feldspar | 35 | 50 | 30 | 25 | ------ | ------ | ------ |
| Ball Clay | 15 | 10 | 8 | 10 | ------ | ------ | ------ |
| Kaolin | 30 | 30 | 37 | 40 | 15 | ------ | ------ |
| Talc | ---- | ---- | ---- | ---- | 60 | ------ | ------ |
| Dolomite | ---- | ---- | ---- | 2 | ------ | ------ | ------ |
| $BaCO_3$ | ---- | ---- | ---- | ---- | 17.5 | ------ | ------ |
| $MgCO_3$ | ---- | ---- | 1 | ---- | 7.5 | ------ | ------ |
| $SiO_2$ | 20 | 10 | 25 | 22 | ------ | 9–10 | 2 |
| CaO | ---- | ---- | ---- | ---- | ------ | 1 | 1 |
| MgO | ---- | ---- | ---- | ---- | ------ | 3–4 | 1 |
| $Na_2O$ | ---- | ---- | ---- | ---- | ------ | 1–5 | ½ |
| $Al_2O_3$ | ---- | ---- | ---- | ---- | ------ | (1) | 95.5 |

1 Remainder.

Firing of coated refractory substrate is done in a furnace in which both atmosphere and temperature can be controlled. The first firing is done in an oxidizing atmosphere, for example, air, oxygen or oxygen mixed with an inert gas such as nitrogen. This firing step is carried out under conditions sufficient to volatilize the fluid suspending media, to oxidize at least the surface portion of the copper particles if metallic copper was initially used, and to commence formation of a refractory substrate-to-glass-to-copper oxide bond. The temperatures and firing times are interdependent in that the higher the temperature, the shorter the firing time required to achieve these effects. The maximum permissible temperature is limited by the melting point of copper. The minimum temperature is determined by the volatilization temperature of the fluid suspending vehicle used and the temperature required to commence formation of the refractory substrate-to-glass-to-copper oxide bond. This bonding temperature is dependent upon the temperature required to partially sinter the glass and to cause wetting of the refractory substrate and at least part of the copper oxide by the glass. Such wetting and sintering temperatures are dependent upon the glass flux used. Temperatures ranging from, for example, 500° C. to 1050° C. for two to sixty minutes have been successfully used, with an intermediate range of 700–900° C. for ten to thirty minutes and a preferred temperature of 750° C. for fifteen minutes. Longer firing times are not harmful, however.

After the oxidizing cycle is complete, the coated refractory substrate is fired in a controlled atmosphere of 55 to 89 percent by volume of nitrogen, 8 to 44 percent by volume of hydrogen and 0.4 to 6 percent by volume of oxygen. This second firing may commence immediately after the first firing without any cooling of the refractory substrate. Alternatively, the refractory substrate may be cooled before undergoing this second firing. The times and temperatures of this firing are again variable and interdependent. The only requirements are that the refractory substrate-to-glass-to-copper oxide bond be completed and the copper oxide which has not been wet by the glass be reduced. The maximum temperature is limited by the melting point of copper while the minimum temperature is again dependent upon the wetting and sintering temperature of the glass flux employed and the temperature required to reduce the copper oxide which has not been wet by the glass. Temperatures ranging from, for example, 600° C. to 1050° C. for fifteen minutes to two hours have proven satisfactory with an intermediate range of approximately 750° C. to 950° C. for twenty minutes to one hour and a preferred temperature of 850° C. for thirty minutes. Again, longer firing times are not harmful.

Specific examples of procedures used in the preparation of printed circuit patterns are given below. In all cases, a metallic copper layer firmly bonded to the refractory substrate and exhibiting excellent electrical characteristics was formed. The solderability of the metallic layer was also very good. These examples are to be considered as illustrative only and not as limiting in any way the scope and spirit of the invention.

*Example 1*

Glass particles, formed by fusing and fritting the following ingredients, were ground to approximately one-half to 25 microns in size.

| Batch Ingredients | Parts by Weight | Melt Ingredient | Parts by Weight |
|---|---|---|---|
| $Li_2CO_3$ | 12.3 | $Li_2O$ | 5.0 |
| $Na_2CO_3$ | 36.4 | $Na_2O$ | 21.4 |
| $CaCO_3$ | 5.0 | CaO | 2.8 |
| $BaCO_3$ | 9.9 | BaO | 7.7 |
| $SiO_2$ | 43.1 | $SiO_2$ | 43.1 |
| $H_3BO_3$ | 35.5 | $B_2O_3$ | 20.0 |

Four grams of ground glass was combined with forty grams of copper particles, approximately one-half to 25 microns in size. Equal parts by weight of this glass-metal mixture and "Acryloid A–10" were combined to give a pasty suspension. The ingredients were ball milled together for twenty-four hours to assure homogeneity of the resultant paste. A one mil thick pattern of the pasty suspension was applied to a refractory substrate having the composition F of Table II by forcing the paste through a 120-mesh screen. The resulting printed base was then fired in air for fifteen minutes at a temperature of 750° C., followed by a firing at 850° C. for thirty minutes in an atmosphere of 85 percent by volume of nitrogen, 14.3 percent by volume of hydrogen and 1.7 percent by volume of oxygen. The base was then withdrawn to a cool portion of the furnace and cooled in the same controlled atmosphere.

*Examples 2–15*

Examples 2–15 tabulated in Table III illustrate various printed circuits formed by the procedure of Example 1. In these examples the composition of the controlled atmosphere was varied and either copper or copper oxide was used in the initial paste.

Table III

| Example No. | Copper or Copper Oxide | Controlled Atmosphere, percent by volume | | |
|---|---|---|---|---|
| | | $N_2$ | $H_2$ | $O_2$ |
| 2 | Copper | 83.9 | 14.0 | 2.1 |
| 3 | do | 89.0 | 8.0 | 3.0 |
| 4 | do | 80.6 | 16.7 | 2.7 |
| 5 | do | 83.8 | 13.7 | 2.5 |
| 6 | Copper Oxide | 83.7 | 13.5 | 2.8 |
| 7 | do | 84.4 | 15.2 | 0.4 |
| 8 | do | 84.0 | 14.3 | 1.7 |
| 9 | do | 84.1 | 14.6 | 1.3 |
| 10 | do | 88.8 | 8.2 | 3.0 |
| 11 | do | 72.6 | 25.0 | 2.4 |
| 12 | do | 66.9 | 30.8 | 2.3 |
| 13 | do | 83.7 | 13.5 | 2.8 |
| 14 | do | 55.0 | 43.5 | 1.5 |
| 15 | do | 83.0 | 11.0 | 6.0 |

What is claimed is:

1. The method of forming a conductive copper layer on a refractory substrate which comprises applying to said refractory substrate a mixture of from 5 to 50 parts by weight of a material selected from the group consisting of copper and copper oxide, and one part by weight of a reduction-resistant glass flux, said mixture being suspended in a volatile and decomposable fluid suspending medium, firing said substrate in an oxidizing atmosphere until said glass flux is partially sintered and wets said refractory substrate and said suspending medium is volatilized leaving substantially no residue, and then firing said substrate in a controlled atmosphere of 55 to 89 percent by volume of nitrogen, 8 to 44 percent by volume of hydrogen and 0.4 to 6 percent by volume of oxygen until the sintering of said glass flux is completed.

2. The method in accordance with claim 1 wherein said material is copper.

3. The method in accordance with claim 1 wherein said material is copper oxide.

4. The method in accordance with claim 1 wherein said reduction-resistant glass flux is compounded from oxides having the following compositions in the melt:

| Melt ingredient: | Parts by weight |
|---|---|
| $Li_2O$ | 0–15 |
| $Na_2O$ | 0–25 |
| $CaO$ | 0–10 |
| $BaO$ | 0–20 |
| $MgO$ | 0– 2 |
| $Al_2O_3$ | 0–20 |
| $SiO_2$ | 5–80 |
| $B_2O_3$ | 0–30 |
| $K_2O$ | 0– 5 |
| $P_2O_5$ | 0–80 |

5. The method in accordance with claim 4 wherein said reduction-resistant glass has the following composition in the melt:

| Ingredients: | Parts by weight |
|---|---|
| $Li_2O$ | 5.0 |
| $Na_2O$ | 21.4 |
| $CaO$ | 2.8 |
| $BaO$ | 7.7 |
| $SiO_2$ | 43.1 |
| $B_2O_3$ | 20.0 |

6. A printed circuit board in which the conductive pattern is formed in accordance with the process of claim 1.

References Cited in the file of this patent

UNITED STATES PATENTS

| | | |
|---|---|---|
| 2,407,251 | Christensen | Sept. 10, 1946 |
| 2,886,476 | Dumesnil et al. | May 12, 1959 |